(12) United States Patent
Lee (10) Patent No.: US 6,445,518 B1
(45) Date of Patent: Sep. 3, 2002

(54) THREE DIMENSIONAL LEAD INSPECTION SYSTEM

(75) Inventor: Pao Meng Lee, Melaka (MY)

(73) Assignee: Semiconductor Technologies & Instruments, Inc., Plano, TX (US)

( * ) Notice: Subject to any disclaimer, the term of this patent is extended or adjusted under 35 U.S.C. 154(b) by 84 days.

(21) Appl. No.: 09/723,986

(22) Filed: Nov. 28, 2000

(51) Int. Cl.[7] ................................................. G02B 5/04

(52) U.S. Cl. ........................... 359/833; 348/92; 348/95; 348/131; 250/559.08; 250/559.36

(58) Field of Search ................................ 359/625, 472, 359/725, 726, 727, 728, 831, 832, 833, 834, 837, 599; 356/237, 239; 257/48; 348/86, 87, 92, 94, 95, 125, 126, 131; 250/559.01, 559.04, 559.07, 559.08, 559.36

(56) References Cited

U.S. PATENT DOCUMENTS

| | | | | |
|---|---|---|---|---|
| 5,917,655 A | * | 6/1999 | Lehnen et al. | 359/472 |
| 6,128,034 A | * | 10/2000 | Harris et al. | 348/126 |
| 6,307,210 B1 | * | 10/2001 | Suzuki et al. | 250/559.08 |

* cited by examiner

*Primary Examiner*—Cassandra Spyrou
*Assistant Examiner*—Euncha Cherry
(74) *Attorney, Agent, or Firm*—Akin, Gump, Strauss, Hauer & Feld, LLP; Christopher J. Rourk (57) ABSTRACT

A semiconductor device lead inspection apparatus and method are provided for capturing images of the semiconductor edges and leads along two optical axes which have different directions in a plane perpendicular to the semiconductor device edge. A first image is reflected off an optical surface of a prism to a direction corresponding to the camera optical axis. A second image is reflected by two optical surfaces of the prism to a direction corresponding to the camera optical axis.

14 Claims, 6 Drawing Sheets

THREE DIMENSIONAL LEAD INSPECTION SYSTEM

BACKGROUND OF INVENTION

This invention relates to devices for inspecting the leads of integrated circuit or semiconductor devices. Known semiconductor device lead inspection systems are used to determine the position and orientation of semiconductor device leads after manufacture to find defects in the leads, such as bent leads, tweeze leads and the like. Prior art systems are mainly intended to provide a two dimensional view of the leads, which cannot be used to measure the lead standoff and coplanarity. In some cases, two or three imaging devices with various viewing angles are used to inspect device leads. In existing devices, the position of lead standoff may be measured from an optical reference such as a track upon which the semiconductor device is positioned for purposes of inspection. In this event, the accuracy of positioning the device on the inspection station can affect the accuracy of the measurements of the lead positions.

It is an object of the present invention to provide images of a semiconductor device and its leads which provides geometrical information of the lead positions with respect to the edge of the semiconductor device body.

SUMMARY OF THE INVENTION

According to the invention there is provided an apparatus for providing first and second backlit images of a semiconductor device edge and leads extending therefrom, the images being representative of first and second viewing angles corresponding to first and second different optical axes, as measured in a plane perpendicular to the device edge. At least one illuminator provides diffuse backlight illumination of said device edge and leads along the first and second optical axes. A triangular prism is arranged with a first optical surface facing the device edge and intersecting the first and second optical axes, a second optical surface forming an acute angle with the first optical axes, and a third optical surface. The first and second surfaces are at selected angles to the first and second optical axes to cause a first image of the device edge and leads along the first optical axis to be reflected by the second optical surface and emerge from the third optical surface in direction corresponding to a third optical axis, and to cause a second image of the device edge and the leads along the second optical axis to be reflected by the second optical surface and the first optical surface and emerge from the third optical surface in a direction corresponding to the third optical axis.

A camera is arranged to capture the first and second images along the third optical axis. In one arrangement the illuminator is an illuminated platform for holding the device. The camera may be arranged on a side of the device opposite the illuminated platform when the device is received on the platform. In one arrangement for providing backlit images of device edges and leads on two opposite sides of a semiconductor device, there are provided two triangular prisms on opposite sides of the device and on opposite sides of the third optical axis. In a preferred arrangement the first and second optical surfaces intersect at an angle of about 30 degrees. The prism may be a right angle prism, or an isosceles triangular prism, wherein the first and second optical surfaces form equal angles with the third optical surface. The third optical surface may be perpendicular to the third optical axis. The first and second optical paths preferably intersect the second optical surface at an angle that is greater than the critical angle, measured from the normal direction of the second optical surface, and the third optical axis preferably intersects the first optical surface at an angle that is greater than the critical angle, measured from the normal direction of said first optical surface.

According to the invention there is provided a method for forming first and second backlit images of a semiconductor device edge and leads extending therefrom, wherein the images represent first and second viewing angles corresponding to first and second optical axes as measured in a plane perpendicular to the device edge. The device edge and leads are illuminated with backlight diffuse illumination radiating in the directions of the first and second optical axes. A triangular prism is arranged having a first optical surface facing the device edge, a second optical surface forming an acute angle with the first optical surface and a third optical surface. A first image of the device edge and leads is reflected by the second optical surface in a direction emerging from the third optical surface corresponding to a third optical axis. A second image of the device edge and leads is reflected by the second and first optical surfaces in a direction emerging from the third optical surface corresponding to the third optical axes. The first and second images are captured along the third optical axis.

The illumination may be supplied by at least one illuminator arranged to radiate in the direction of the first and second optical axes toward the device edge and leads. The first and second backlit images may be captured on a single image plane of a camera on a side of the device opposite the illuminator. Two of the prisms may be provided on opposite sides of the device; whereby the first and second images of the edges and leads on opposite sides of a semiconductor device are reflected in directions corresponding to the third optical axis; and wherein the first and second images of each of the device edges and leads are captured.

For a better understanding of the present invention, together with other and further objects, reference is made to the following description, taken in conjunction with the accompanying drawings, and its scope will be pointed out in the appended claims.

DESCRIPTION OF THE INVENTION

Figure 1:
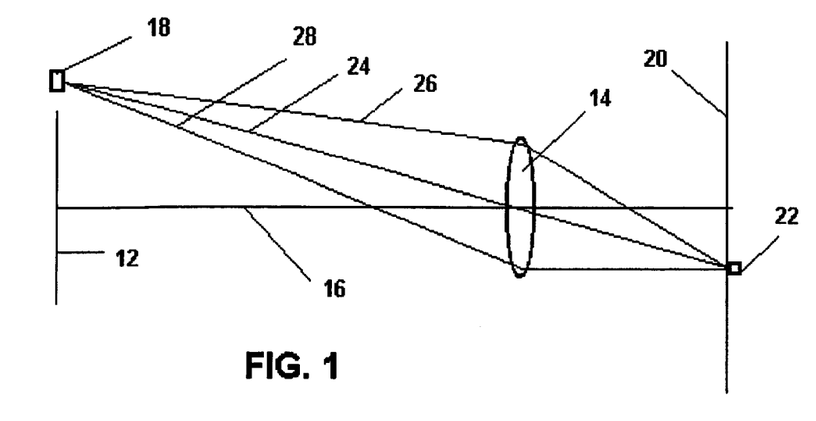
FIG. 1 is a diagram of an imaging system for purposes of defining terminology.
Figure 2:
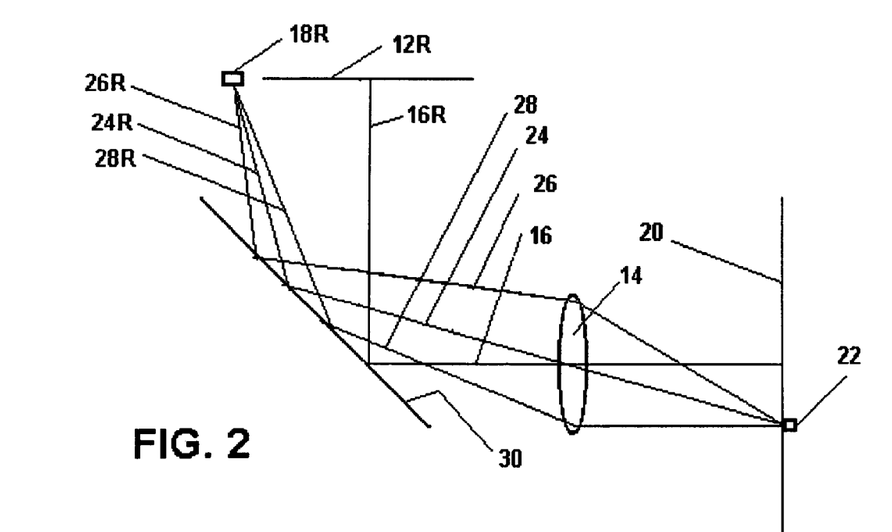
FIG. 2 is a further drawing of an imaging system for purposes of defining terminology.

Referring to FIGS. 1 and 2, there is shown an arrangement for imaging an object 18 in an object plane 12 onto an image plane 20, for purposes of explaining the terminology used in the present application. An imaging system, having a lens 14 with an axis of symmetry 16 for imaging objects 18 in an object plane 12 onto an image plane 20 is conventionally referred to as having an optical axis 16, which frequently is the axis of symmetry of lens 14. Those skilled in the art will recognize that an image of object 18 in object field 12 will be formed as image element 22 in image plane 20. The extent of object field 12 naturally depends upon the size of the image plane 20 and the geometric configuration of the imaging system. In connection with describing the present invention, the optical axis 16 of a camera containing a lens 14 and an image plane 20 is generally referred to as describing the central axis of the imaging system, such as optical axis 16. It will be recognized by those skilled in the art that the actual light paths from object 18 to object image 22 follows a direction 24 and includes light at the periphery of lens 14 following optical paths 26 and 28 which are diffracted by lens 14 in connection with forming object image 22. The light paths 24, 26 and 28, while having directions which are different than that of optical axis 16, are referred to herein as corresponding to the optical access, since the optical axis 16 relates to the center of image plane 20 and objects on one or the other side of optical axis 16 will form images in object plane 20.

FIG. 2 shows a configuration wherein a reflector 30, such as a mirror or an internally reflecting surface of a prism is used in connection with the formation of an image of an object on an object plane 20. Mirror 30 has the effect of reflecting an image on optical axis 16R into optical axis 16. The actual light rays from objects 24R, 26R and 28R are likewise reflected by mirror 30. In connection with describing the present invention, the image of object 18R, which follows paths 24R, 26R and 28R via mirror 30 to object image 22 in image plane 20 are said to correspond to optical axis 16R. Mirror 30 reflects, or more generally "deflects" the image from a direction corresponding to optical axis 16R to a direction corresponding to axis 16.

Figure 3:
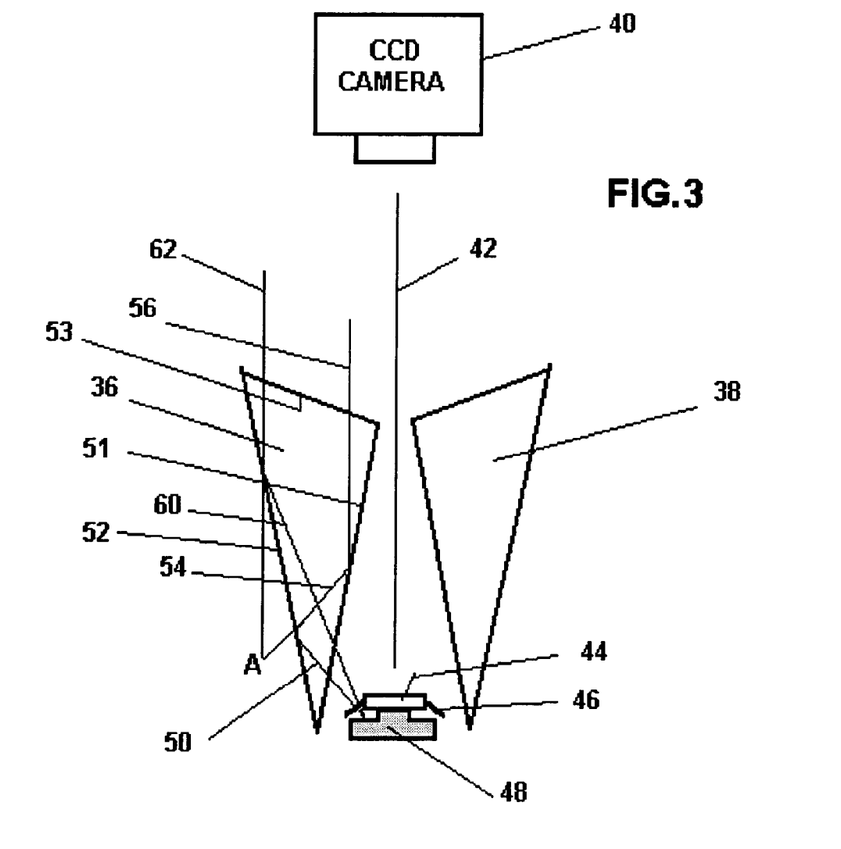
FIG. 3 is a diagram illustrating the arrangement of a first embodiment of the present invention.

FIG. 3 is a diagram illustrating a first embodiment of the present invention for providing images of semiconductor device edges and leads which extends from the edges. A camera, such as a digital CCD camera 40, is arranged with an optical axis 42 facing toward a device inspection station containing semiconductor device 44. Device 44 in the configuration of FIG. 3 fits on an inspection station track or platform 48 which provides diffuse backlight illumination of the edges and leads 46 of device 44. The diffuse illumination is over a range of directions which include directions corresponding to optical axis 50 and directions corresponding to optical axis 60. Platform 48, may, for example, comprise a transparent plastic platform having etched surfaces which cause diffusion of light. Light may be supplied to platform 48 by use of embedded LED's or by providing other internal illumination which causes the surfaces of platform 48 to provide diffuse backlight illumination for viewing of the edges and leads of semiconductor device 44.

In the embodiment of FIG. 3 there are provided first and second prisms 36 and 38 for deflecting backlit images of the edges on each side of device 44 and leads 46 for imaging in camera 40. Prism 36 is a right triangular prism having optical surfaces 51, 52 and 53. Light emanating from the diffuse illuminator 48 generally along a first optical axis 50 passes through first prism optical surface 51 and is internally reflected by second optical surface 52 onto a path 54 which is reflected by first optical surface 51 along direction 56, which corresponds to the first optical access 42, so that a first backlit image of the edges and leads 46 of semiconductor device 44 is formed in the image plane of CCD camera 40.

Light emitting from illuminator 48 along a second optical axis 60 is reflected by optical surface 52 and emerges from optical surface 53 along a direction 62 corresponding to optical axis 42 of camera 40. The image of the edges of device 44 and leads 46 along optical axis 60 accordingly forms a second backlit image in camera 40.

Those skilled in the art will recognize that a prism provides total internal reflection when the angle of incidence of light along optical axis 50 or 60 strikes reflecting surface 52 at an internal angle of incidence which exceeds the "critical angle" as measured from the internally normal direction of surface 52. This must take into account diffraction which occurs at optical surface 51, through which the image along optical axes 50, 60 passes. The image reflected by optical surface 52 along path 54 should likewise be at an angle that is greater than the critical angle measured from the normal of optical surface 51. Likewise direction 56 corresponding to optical axis 42 is preferably at an angle to surface 51 that is greater than the critical angle. In the arrangement of FIG. 3, prisms 36 and 38 are triangular right angle prisms having an angle between surfaces 51 and 52 which is preferably about 30 degrees.

Figure 5:
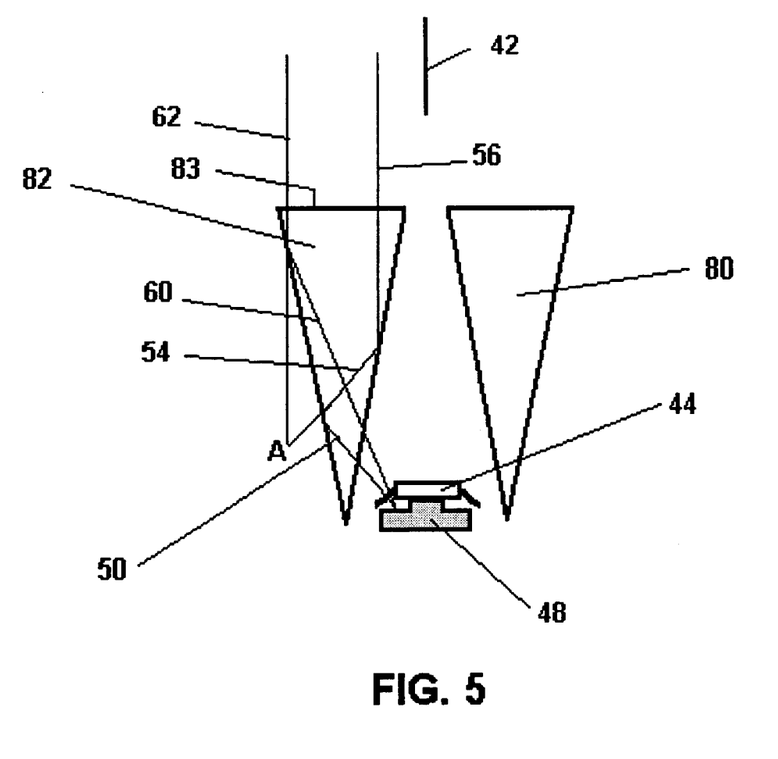
FIG. 5 is a drawing illustrating a second embodiment of the present invention.
Figure 6:
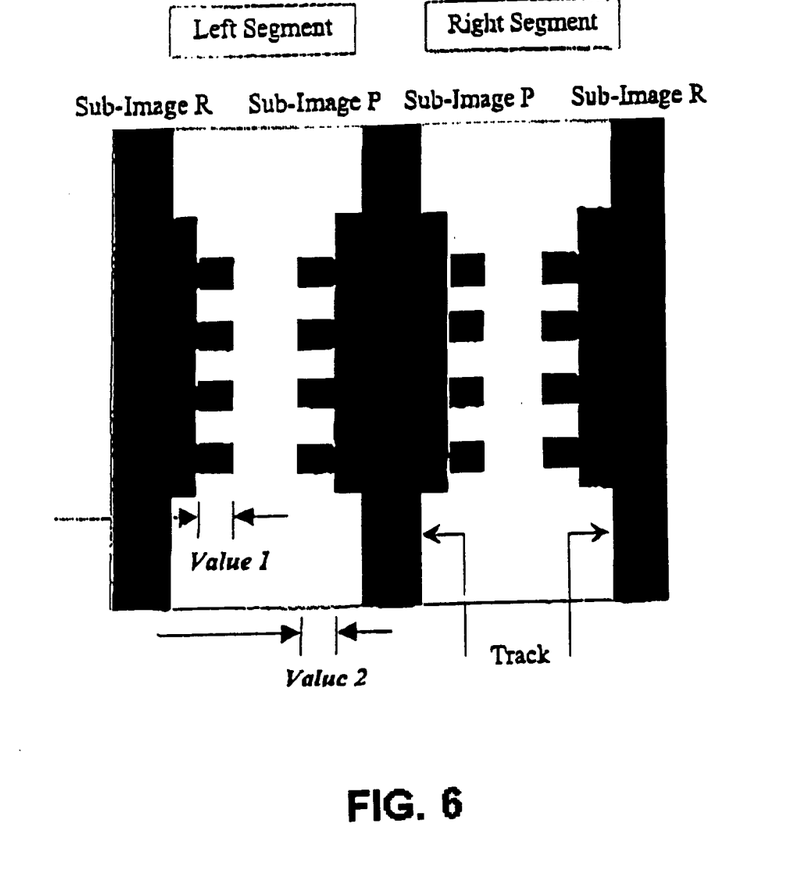
FIG. 6 is a representation of an image formed using the FIG. 3 apparatus.

Referring to FIG. 6 there is shown the image of the semiconductor device 44 and its leads 46 as formed on the image plane of CCD camera 40 using the structure of FIG. 3. A first sub-image of each edge labeled P in FIG. 5 is formed near the center of the image plane of CCD camera 40 and represents the backlit image along optical axis 50, as reflected by surfaces 52 and 51. Right and left reflected sub-images R representing the semiconductor device edges and leads on two opposite sides of the semiconductor device, as reflected internally by surface 52 in prisms 36 and 38 are formed to the sides of the image plane and represent images of the semiconductor devices edges and leads 46 taken along a viewing angle corresponding to optical axis 60.

Those skilled in the art will recognize that from the images P and R of FIG. 6 it is possible to determine the X, Y and Z positions of the leads 46 with respect to the edges of semiconductor body 44. The image P taken along optical axis 50, shown in FIG. 3, together with the image R taken along optical axis 60 enables the determinations not only of the X and Y positions of the leads 46 from edges of the semiconductor device 44 but also a determination of the Z position, which corresponds to the lead standoff, which is the spacing between the lead edges and the semiconductor device body in the vertical direction of FIG. 3.

Figure 7:
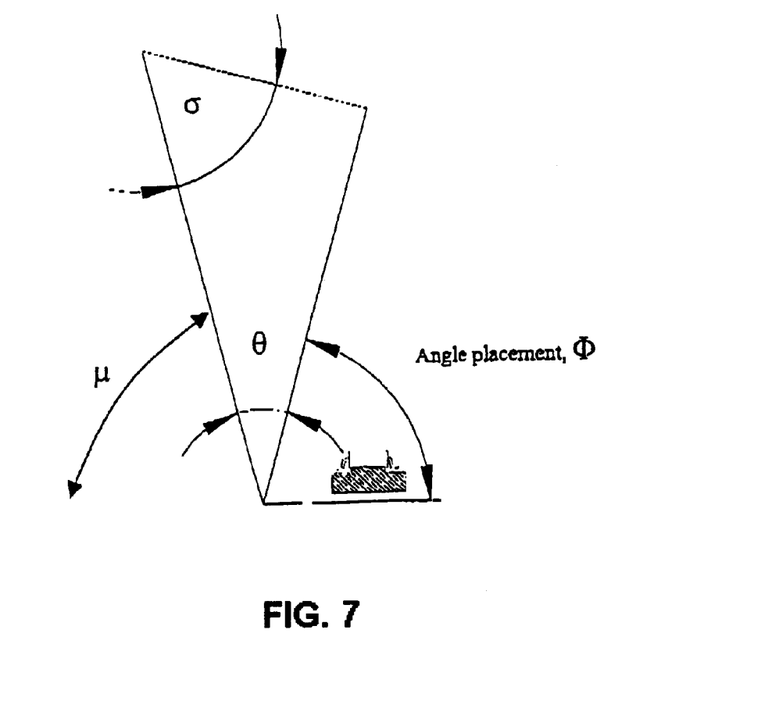
FIG. 7 is a drawing identifying prism angles.
Figure 8:
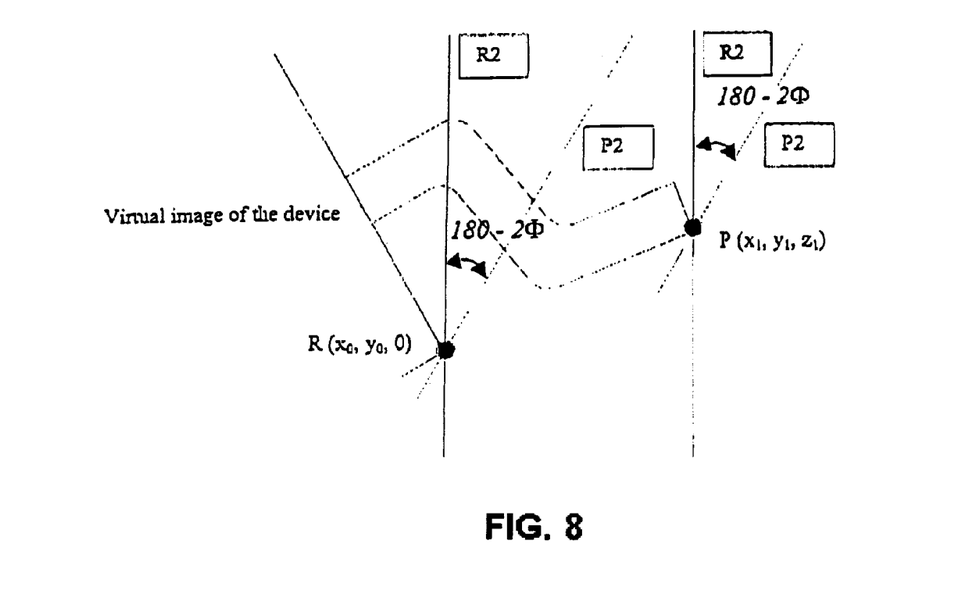
FIG. 8 is a geometrical drawing for purposes of explaining a calculation of lead positions using the FIG. 5 images.
Figure 9:
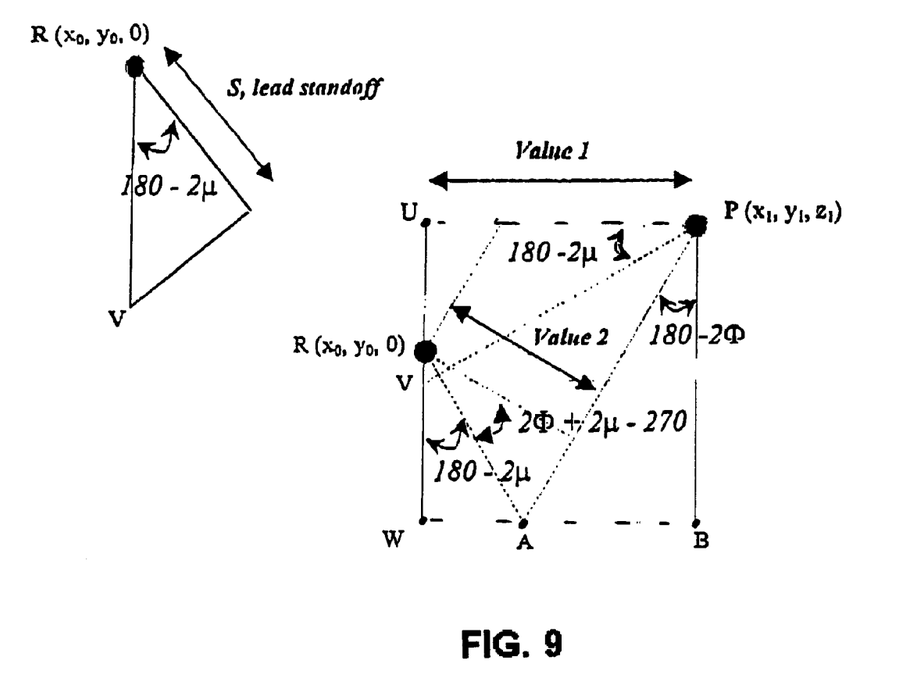
FIG. 9 is a drawing showing calculations for computing lead positions using the FIG. 5 images.

A segment of the geometrical layout of the virtual image of the device is illustrated in FIG. 9 to determine lead standoff in the Z direction. Lead standoff is the distance measured from lead tip, denoted as point P $(x_1, y_1, z_1)$ to the device edge, denoted as point R $(x_0, y_0, 0)$ in z-axis. As every measurement is made reference to the device edge, the z value of point R is equal to zero. When image routes along direction 62 and 56 are extended, as shown in FIG. 3, and intercept at point P and point R on virtual image of the device A, as shown in FIG. 8, the angle made between the two image routes is $180°-2\Phi$ (see FIG. 7). Both Value 1 and Value 2 are measured from the captured image as shown in FIG. 6. Value 1 is measured from tip to the body device in sub-image R whereas Value 2 is measured from tip to the body device in sub-image P. Coordinates x and y of both points can be determined from two dimensional prospective. It is therefore that lead standoff, $z_1$ is derived from the following equations:

$$RV+VW=RA \cos(180-2\mu)=\text{Value 2} \cos(180-2\mu)/\cos(2\Phi+2\mu-270)$$

$$PB=UR+RV+VW$$

Figure 4:
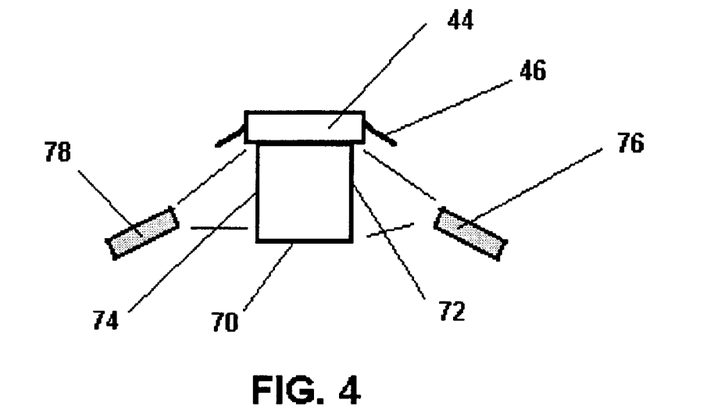
FIG. 4 is a drawing illustrating an alternate embodiment of the inspection station and illuminators for use in the embodiment of FIG. 3.

$(UR+RV)/\text{Value } 1 = \tan(180-2\mu)$ $WA/(RV+VW) = \tan(180-2\mu)$ $AB = \text{Value } 1 - WA$ $AB/PB = \tan(180-2\Phi)$ $PB = AB/\tan(180-2\Phi)$ $= (\text{Value } 1 - WA)/\tan(180-2\Phi)$ $= (\text{Value } 1 - (RV+VW)\tan(180-2\mu))/\tan(180-2\Phi)$ knowing that $RV+VW = \text{Value } 2 \cos(180-2\mu)/\cos(2\Phi+2\mu-270)$ and $PB = UR+RV+VW$ As a result, $UR = (\text{Value } 1-(RV+VW)\tan(180-2\mu))/\tan(180-2\Phi)-(RV+VW)$ $RV = \text{Value } 1 \tan(180-2\mu) - UR$ Hence, lead standoff $= RV \cos(180-2\mu)$ FIG. 4 is drawing illustrating an alternate arrangement for illuminating the leads 46 and edges of device 44 in connection with the practice of the present invention. In the illustration of FIG. 4 semiconductor device 44 is arranged on a track 70 which has side surfaces 72 and 74 which are illuminated respectively by diffuse light sources 76 and 78. The illumination of surfaces 72 and 74 provide by reflection diffusion backlight illumination of the edges of device 44 and projecting lead 46.

An alternate embodiment of the invention is shown in FIG. 5, wherein prisms 80, 82 are isosceles triangle prisms, which have side surfaces of equal length and at equal angles to surface 83, which is approximately perpendicular to optical axis 42.

While there have been described what are believed to be the preferred embodiments of the invention, those skilled in the art will recognize that other and further changes and modifications may be made thereto without departing from the spirit of the invention, and is intended to claim all such changes and modifications as fall within the true scope of the invention.

I claim:

1. Apparatus for providing first and second backlit images of a semiconductor device edge and leads extending therefrom, said images representative of first and second viewing angles corresponding to first and second different optical axes as measured in a plane perpendicular to said device edge, comprising:

at least one illuminator providing diffuse backlight illumination of said device edge and leads along said first and second optical axes;

a triangular prism having a first optical surface facing said device edge and intersecting said first and second optical axes, a second optical surface forming an acute angle with said first optical axes, and a third optical surface, said first and second surfaces being at selected angles to said first and second optical axes to cause a first image of said device edge and leads along said first optical axis to be reflected by said second optical surface and emerge from said third optical surface in direction corresponding to a third optical axis and to cause a second image of said device edge and said leads along said second optical axis to be reflected by said second optical surface and said first optical surface and emerge from said third optical surface in a direction corresponding to said third optical axis; and a camera arranged to capture said first and second images along said third optical axis.

2. Apparatus as specified in claim 1 wherein said illuminator comprises an illuminated platform for holding said device.

3. Apparatus as specified in claim 2 wherein said camera is arranged on a side of said device opposite said illuminated platform when said device is received on said platform.

4. Apparatus as specified in claim 3 for providing backlit images of device edges and leads on two opposite sides of a semiconductor device and including two said triangular prisms on said opposite sides of said device and arranged on opposite sides of about said third optical axis.

5. Apparatus as specified in claim 1 wherein said first and second optical surfaces intersect at an angle of about 30 degrees.

6. Apparatus as specified in claim 1 wherein said prism is right angle prism.

7. Apparatus as specified in claim 1 wherein said first and second optical surfaces form equal angles with said third optical surface.

8. Apparatus as specified in claim 7 wherein said third optical surface is perpendicular to said third optical axis.

9. Apparatus as specified in claim 1 wherein said first and second optical paths intersect said second optical surface at an angle that is greater than the critical angle, measured from the normal direction of said second optical surface.

10. Apparatus as specified in claim 1 wherein said third optical axis intersects said first optical surface at an angle that is greater than the critical angle, measured from the normal direction of said first optical surface.

11. A method for providing first and second backlit images of a semiconductor device edge and leads extending therefrom, said images representing first and second viewing angles corresponding to first and second optical axes as measured in a plane perpendicular to said device edge, comprising:

illuminating said device edge and leads with backlight diffuse illumination radiating in the directions of said first and second optical axes;

providing a triangular prism having a first optical surface facing said device edge, a second optical surface forming an acute angle with said first optical surface and a third optical surface;

a first image of said device edge and leads by said second optical surface in a direction emerging from said third optical surface corresponding to a third optical axis;

reflecting a second image of said device edge and leads by said second and first optical surfaces in a direction emerging from said third optical surface corresponding to said third optical axes; and capturing said first and second images along said third optical axis.

12. A method as specified in claim 11 wherein said illuminating comprises illuminating from at least one illuminator arranged to radiate in the direction of said first and second optical axes toward said device edge and said leads.

13. A method as specified in claim 11 wherein said capturing said first and second backlit images comprises capturing said images on a single image plane of a camera on a side of said device opposite said at least one illuminator.

14. A method as specified in claim 11 for imaging device edges and leads on two opposite sides of a semiconductor, wherein there are provided two of said prisms on said opposite sides of said device; wherein said first and second images of each of said edges and leads are reflected in directions corresponding to said third optical axis; and wherein said first and second images of each of said device edges and leads are captured.

* * * * *